US009595940B2

(12) United States Patent
Ri

(10) Patent No.: US 9,595,940 B2
(45) Date of Patent: Mar. 14, 2017

(54) FILTER, DUPLEXER AND MODULE

(71) Applicant: TAIYO YUDEN CO., LTD., Tokyo (JP)

(72) Inventor: Tetsu Ri, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/728,518

(22) Filed: Jun. 2, 2015

(65) Prior Publication Data

US 2015/0381142 A1 Dec. 31, 2015

(30) Foreign Application Priority Data

Jun. 27, 2014 (JP) ................................ 2014-132939

(51) Int. Cl.

| | |
|---|---|
| ***H03H 9/70*** | (2006.01) |
| ***H03H 9/54*** | (2006.01) |
| ***H03H 9/64*** | (2006.01) |
| ***H03H 9/72*** | (2006.01) |
| ***H03H 9/00*** | (2006.01) |
| ***H03H 9/05*** | (2006.01) |
| ***H03H 9/60*** | (2006.01) |

(52) U.S. Cl.

CPC .......... *H03H 9/706* (2013.01); *H03H 9/0004* (2013.01); *H03H 9/0566* (2013.01); *H03H 9/542* (2013.01); *H03H 9/605* (2013.01); *H03H 9/6483* (2013.01); *H03H 9/725* (2013.01)

(58) Field of Classification Search

CPC .... H03H 9/0004; H03H 9/0566; H03H 9/542; H03H 9/605; H03H 9/6483; H03H 9/706; H03H 9/725; H03H 2009/0019

USPC ................................ 333/133, 189, 193, 195

See application file for complete search history.

(56) References Cited

U.S. PATENT DOCUMENTS

| | | | | |
|---|---|---|---|---|
| 2003/0020562 A1* | 1/2003 | Ikada | H03H 9/0576 333/133 |
| 2006/0132260 A1* | 6/2006 | Iwamoto | H03H 9/0571 333/133 |
| 2006/0139120 A1* | 6/2006 | Yamaguchi | H03H 9/6483 333/133 |
| 2007/0268092 A1* | 11/2007 | Inoue | H03H 7/42 333/133 |
| 2010/0188166 A1 | 7/2010 | Hara et al. | |
| 2012/0274416 A1 | 11/2012 | Hara et al. | |
| 2014/0111287 A1 | 4/2014 | Hara et al. | |

FOREIGN PATENT DOCUMENTS

| | | |
|---|---|---|
| JP | 2010-087586 A * | 4/2010 |
| JP | 2010-177770 A | 8/2010 |
| JP | 2012-231437 A | 11/2012 |

* cited by examiner

*Primary Examiner* — Barbara Summons

(74) *Attorney, Agent, or Firm* — Chen Yoshimura LLP

(57) ABSTRACT

A filter includes: one or more series resonators connected in series between an input terminal and an output terminal; one or more parallel resonators connected in parallel between the input terminal and the output terminal; a first inductor having one end connected to at least one of the input terminal and the output terminal; a second inductor having one end connected to a terminal near a ground of at least one of the parallel resonators; and a third inductor connected between a first node and the ground, the first node connecting the other end of the first inductor and the other end of the second inductor.

7 Claims, 14 Drawing Sheets

Tin S Tout P L1 L2 N1 L3

12 Tx S1 S2 S3 S4 Ant P1 P2 P3 L1 L21 L22 L23 N1 L3 Rx 14

FILTER, DUPLEXER AND MODULE

CROSS-REFERENCE TO RELATED APPLICATION

This application is based upon and claims the benefit of priority of the prior Japanese Patent Application No. 2014-132939, filed on Jun. 27, 2014, the entire contents of which are incorporated herein by reference.

FIELD

A certain aspect of the present invention relates to a filter, a duplexer and a module, e.g. to a ladder type filter, a duplexer and a module including the ladder type filter.

BACKGROUND

Recently, the miniaturization and the light weight of a part to be mounted on a mobile communication terminal are required in accordance with the requirement of the miniaturization and the light weight of the mobile communication terminal such as a mobile phone. Moreover, a part including a plurality of functions is also required. In such a situation, a filter and a duplexer which increase an attenuation amount outside a passband are developed. There is a ladder type filter as a filter to be used for the mobile communication terminal.

Patent Documents (Japanese Patent Application Publication Nos. 2010-177770 and 2012-231437) disclose that a plurality of inductors connected to a ground side of a plurality of parallel resonators in a ladder type filter are connected to a common node, and an inductor is connected between the plurality of inductors and a ground.

Since the inductors are provided between the plurality of parallel resonators and the ground, the attenuation amount outside the passband can be increased, but the improvement of the attenuation amount is not sufficient.

SUMMARY OF THE INVENTION

According to a first aspect of the present invention, there is provided a filter including: one or more series resonators connected in series between an input terminal and an output terminal; one or more parallel resonators connected in parallel between the input terminal and the output terminal; a first inductor having one end connected to at least one of the input terminal and the output terminal; a second inductor having one end connected to a terminal near a ground of at least one of the parallel resonators; and a third inductor connected between a first node and the ground, the first node connecting the other end of the first inductor and the other end of the second inductor.

According to a second aspect of the present invention, there is provided a duplexer including: a transmission filter connected between a common terminal and a transmission terminal; and a reception filter connected between the common terminal and a reception terminal; wherein at least one of the transmission filter and reception filter is a filter specified by the above-mentioned first aspect of the present invention.

According to a third aspect of the present invention, there is provided a module including a filter specified by the above-mentioned first aspect of the present invention.

DETAILED DESCRIPTION

First, a description will be given of a present embodiment with reference to drawings.

(First Embodiment)

Figure 1A:
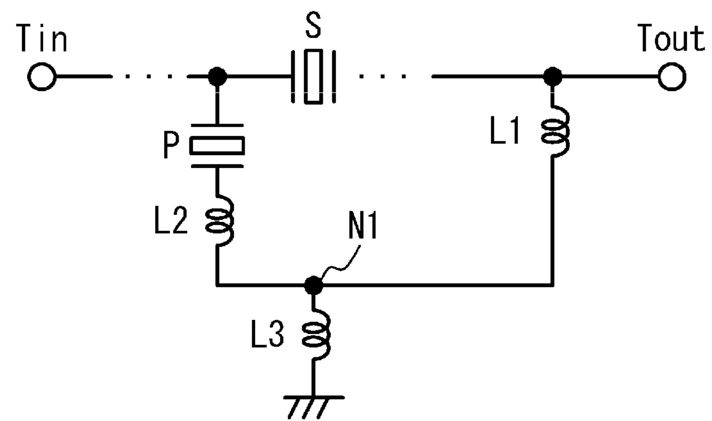
FIGS. 1A and 1B are circuit diagrams of a filter according to a first embodiment.
Figure 1B:
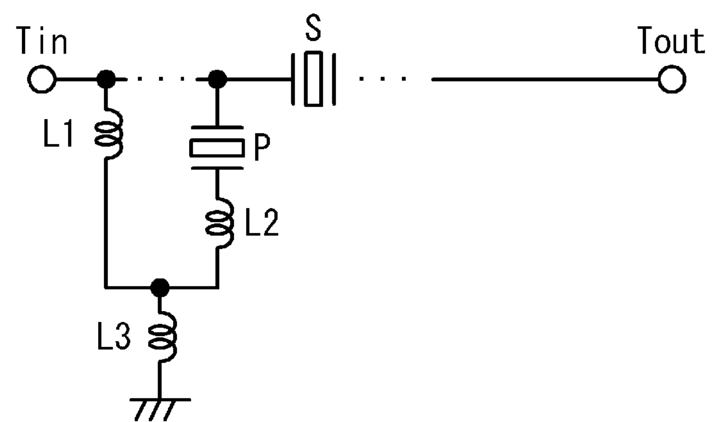

FIGS. 1A and 1B are circuit diagrams of a filter according to a first embodiment. As illustrated in FIG. 1A, one or more series resonators S are connected between an input terminal Tin and an output terminal Tout. One or more parallel resonators P are connected between the input terminal Tin and the output terminal Tout. The number of series resonators and parallel resonators and/or a connection method can be set optionally. An inductor L1 is connected between the output terminal Tout and a node N1 without via the resonators S and P. An inductor L2 is connected between at least one parallel resonator P and the node N1. An inductor L3 is connected between the node N1 and a ground. The inductor L1 matches an impedance of the output terminal Tout with an input impedance, for example.

As illustrated in FIG. 1B, the inductor L1 is connected between the input terminal Tin and the node N1 without via the resonators S and P. The inductor L1 matches an impedance of the input terminal Tin with an output impedance, for example. Since other configurations are the same as corresponding configurations of FIG. 1A, a description thereof is omitted.

In the first embodiment, the inductor L1 may be connected to both of the input terminal Tin and the output terminal Tout. The inductor L2 may be connected to all the parallel resonators P or a part of the parallel resonators P. All the parallel resonators P or a part of the parallel resonators P may be connected to the node N1. The inductor L2 may be provided for each group of the plurality of parallel resonators P. The single inductor L2 may be provided for the plurality of parallel resonators P.

As a variation example 1 of the first embodiment, an attenuation characteristic and an isolation characteristic were simulated using a filter of the first embodiment as a transmission filter of the duplexer of a band 4. A transmission band of the band 4 is from 1710 MHz to 1755 MHz, and a reception band is from 2110 MHz to 2155 MHz.

Figure 2:
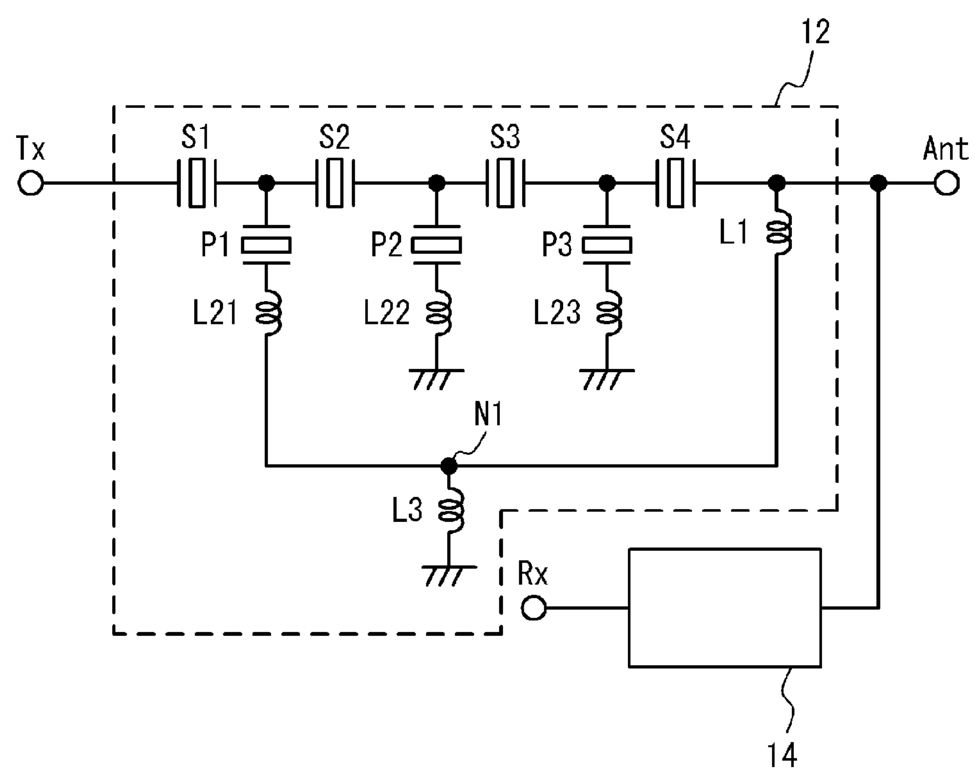
FIG. 2 is a circuit diagram of a duplexer according to a variation example 1 of the first embodiment.

FIG. 2 is a circuit diagram of a duplexer according to a variation example 1 of the first embodiment. As illustrated in FIG. 2, a transmission filter 12 is connected between a common terminal Ant and a transmission terminal Tx. The common terminal Ant corresponds to an output terminal of the transmission filter 12, and the transmission terminal Tx corresponds to an input terminal of the transmission filter 12. A reception filter 14 is connected between the common terminal Ant and a reception terminal Rx. In the transmission filter 12, series resonators S1 to S4 are connected in series between the common terminal Ant and a transmission terminal Tx. Parallel resonators P1 to P3 are connected in parallel between the common terminal Ant and a transmission terminal Tx. The inductor L1 is connected between the common terminal Ant and the node N1. An inductor L21 is connected between the parallel resonators P1 and the node N1. Inductors L22 and L23 are connected between the parallel resonator P2 and the ground and between the parallel resonator P3 and the ground, respectively. An inductor L3 is connected between the node N1 and the ground.

Inductances of the inductors L1, L21 and L3 are 2.5 nH, 2.2 nH and 0.01 nH, respectively. Inductances of the inductors L22 and L23 are optimized so that the attenuation amount becomes large in the reception band.

In a comparative example 1, the inductor L3 of FIG. 2 is not provided, and the inductors L1 and L21 are directly grounded. The inductance of each inductor is optimized so that the attenuation amount becomes large in the reception band.

Figure 3A:
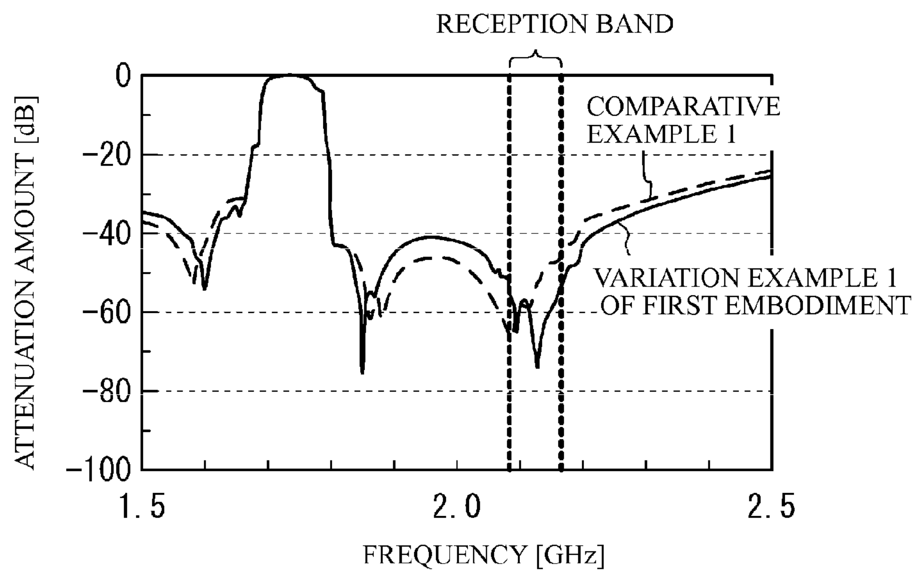
FIG. 3A is a diagram illustrating attenuation characteristics of transmission filters according to the variation example 1 of the first embodiment and a comparative example 1.
Figure 3B:
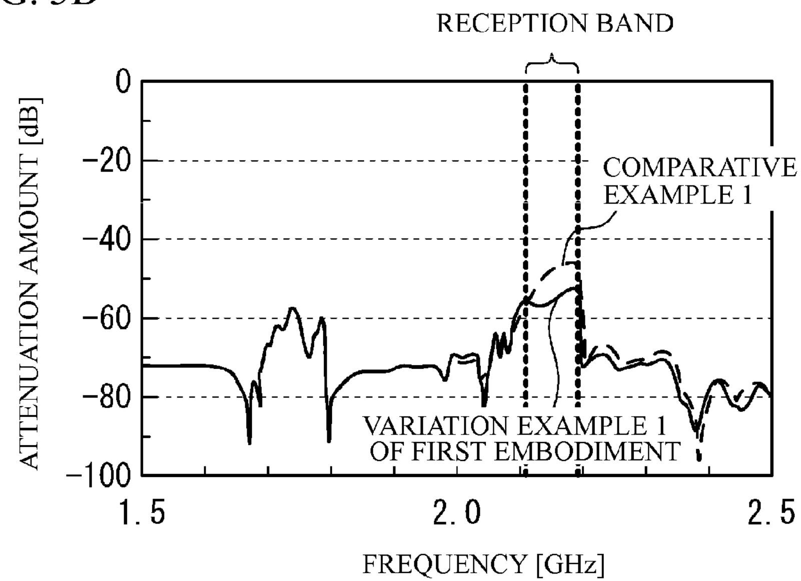
FIG. 3B is a diagram illustrating an isolation characteristic from a transmission terminal to a reception terminal.

FIG. 3A is a diagram illustrating attenuation characteristics of the transmission filters according to the variation example 1 of the first embodiment and the comparative example 1. FIG. 3B is a diagram illustrating the isolation characteristic from the transmission terminal to the reception terminal. As illustrated in FIG. 3A, in the variation example 1 of the first embodiment, the attenuation amount becomes large in frequencies outside a passband of the transmission filter 12, compared with the comparative example 1. Also in the reception band, the attenuation amount is large. As illustrated in FIG. 3B, in the variation example 1 of the first embodiment, the isolation characteristic is improved, compared with the comparative example 1.

As a comparative example 2 of the first embodiment, the attenuation characteristic and the isolation characteristic were simulated using the filter of the first embodiment as the transmission filter of the duplexer of a band 8. The transmission band of the band 8 is from 880 MHz to 915 MHz, and the reception band is from 925 MHz to 960 MHz.

Figure 4:
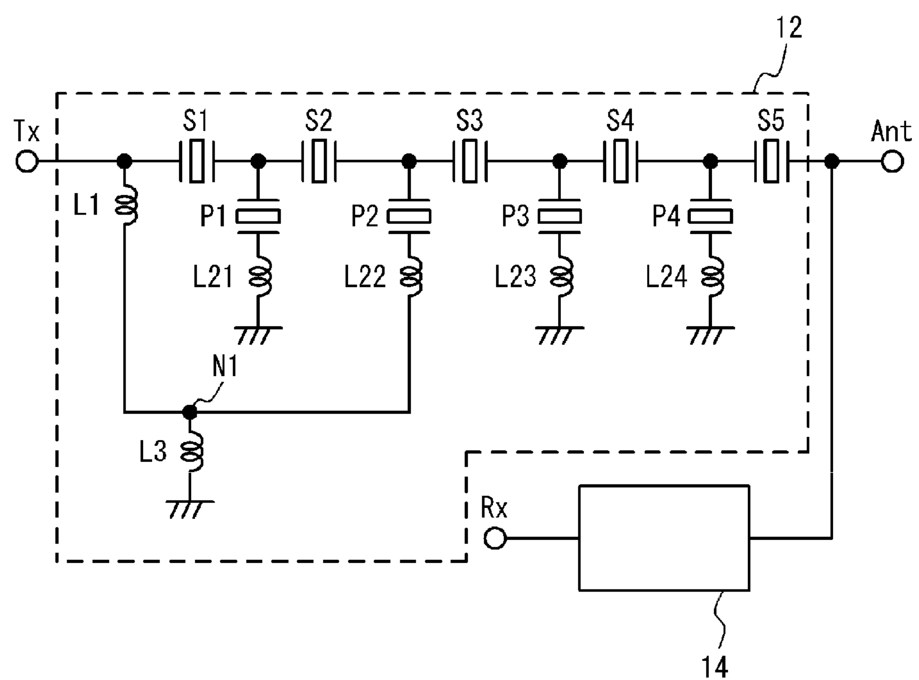
FIG. 4 is a circuit diagram of a duplexer according to a variation example 2 of the first embodiment.

FIG. 4 is a circuit diagram of a duplexer according to the variation example 2 of the first embodiment. As illustrated in FIG. 4, in the transmission filter 12, series resonators Si to S5 are connected in series between the common terminal Ant and the transmission terminal Tx. Parallel resonators P1 to P4 are connected in parallel between the common terminal Ant and the transmission terminal Tx. The inductor L1 is connected between the transmission terminal Tx and the node N1. An inductor L22 is connected between the parallel resonators P2 and the node N1. The inductor L22 is connected between the parallel resonator P2 and the node N1. Inductors L21, L23 and L24 are connected between the parallel resonator P1 and the ground, between the parallel resonator P3 and the ground and between the parallel resonator P4 and the ground, respectively. The inductor L3 is connected between the node N1 and the ground. Since other configurations are the same as corresponding configurations of the variation example 1 of the first embodiment, a description thereof is omitted.

The inductances of the inductors L1, L22 and L3 are 33 nH, 1.9 nH and 0.4 nH, respectively. The inductances of the inductors L21, L23 and L24 are optimized so that the attenuation amount becomes large in the reception band.

In a comparative example 2, the inductor L3 of FIG. 4 is not provided, and the inductors L1 and L22 are directly grounded. The inductance of each inductor is optimized so that the attenuation amount becomes large in the reception band.

Figure 5A:
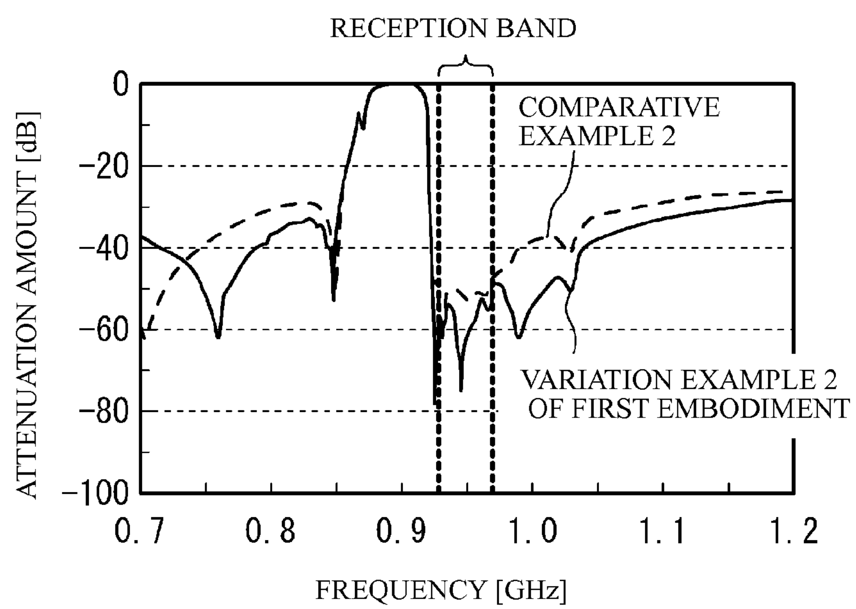
FIG. 5A is a diagram illustrating attenuation characteristics of transmission filters according to the variation example 2 of the first embodiment and a comparative example 2.
Figure 5B:
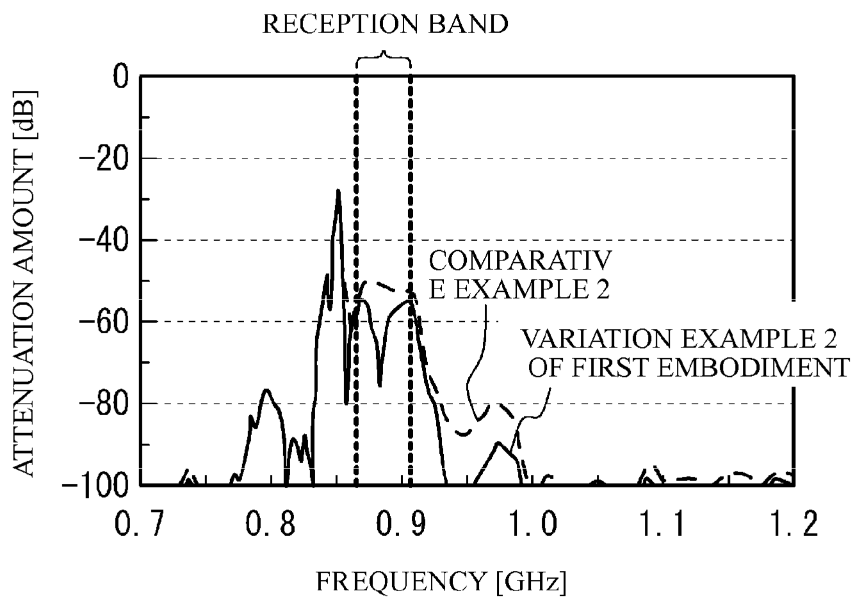
FIG. 5B is a diagram illustrating an isolation characteristic from a transmission terminal to a reception terminal.

FIG. 5A is a diagram illustrating attenuation characteristics of transmission filters according to the variation example 2 of the first embodiment and the comparative example 2. FIG. 5B is a diagram illustrating an isolation characteristic from the transmission terminal to the reception terminal. As illustrated in FIG. 5A, in the variation example 2 of the first embodiment, the attenuation amount becomes large in frequencies outside the passband of the transmission filter 12, compared with the comparative example 2. Also in the reception band, the attenuation amount is large. As illustrated in FIG. 5B, in the variation example 2 of the first embodiment, the isolation characteristic is improved, compared with the comparative example 2.

According to the first embodiment, one end of the inductor L1 (i.e., a first inductor) is connected to at least one of the input terminal Tin and the output terminal Tout, and the other end thereof is connected to the node N1 (i.e., a first node). One end of the inductor L2 (i.e., a second inductor) is connected to the terminal near the ground of at least one of the parallel resonators P, and the other end thereof is connected to the node N1. The inductor L3 (i.e., a third inductor) is connected between the node N1 and the ground. Thus, it is possible to increase the attenuation amount outside the passband of the filter by using the inductors L1 to L3.

Thus, in the first embodiment, a reason that can improve the attenuation characteristic is not clear, but it is thought that the reason is due to the fact that a signal can be fed back via the inductors L1 and L2.

(Second Embodiment)

Figure 6A:
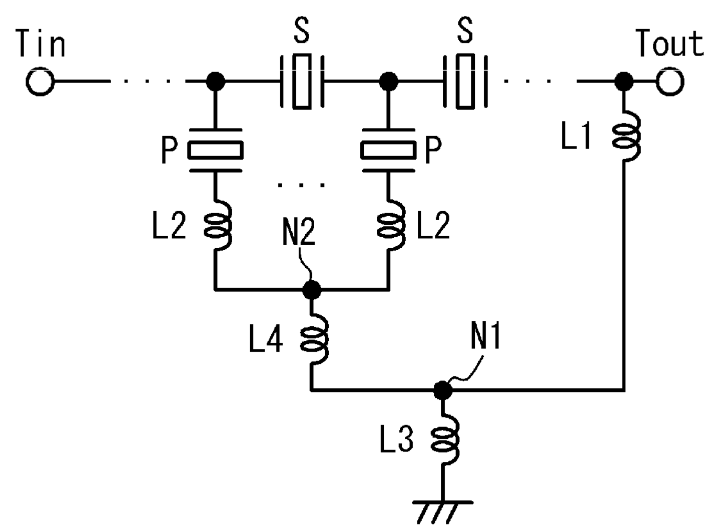
FIGS. 6A and 6B are circuit diagrams of a filter according to a second embodiment.
Figure 6B:
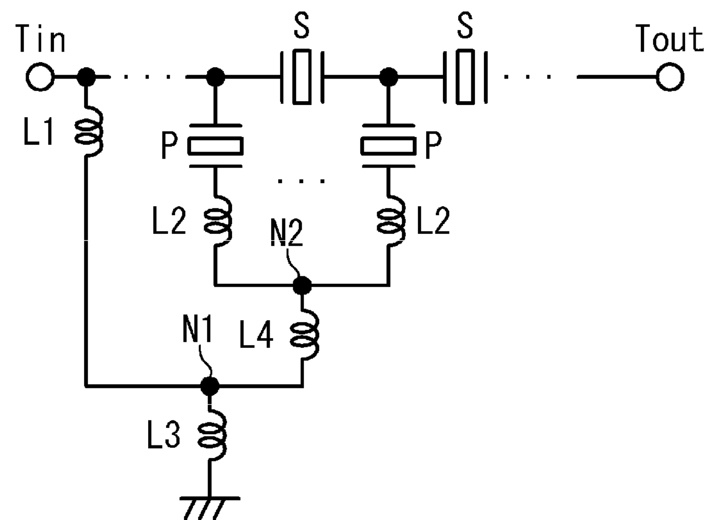

FIGS. 6A and 6B are circuit diagrams of a filter according to a second embodiment. As illustrated in FIG. 6A, the inductors L2 connected to the parallel resonators P are connected to a node N2 in common. An inductor L4 is connected between the node N2 and the node N1. Since other configurations are the same as corresponding configurations of FIG. 1A, a description thereof is omitted.

As illustrated in FIG. 6B, the inductors L2 connected to the parallel resonators P are connected to the node N2 in common. The inductor L4 is connected between the node N2 and the node N1. Since other configurations are the same as corresponding configurations of FIG. 1B, a description thereof is omitted.

In the second embodiment, the inductors L2 need to be connected to at least two parallel resonators P. At least two inductors L2 need to be connected to the node 2. The plurality of nodes N2 may be provided, and the plurality of inductors L4 may be provided.

As a comparative example 1 of the second embodiment, the attenuation characteristic and the isolation characteristic were simulated using the filter of the second embodiment as the transmission filter of the duplexer of a band 1. The transmission band of the band 1 is from 1920 MHz to 1980 MHz, and the reception band is from 2110 MHz to 2170 MHz.

Figure 7:
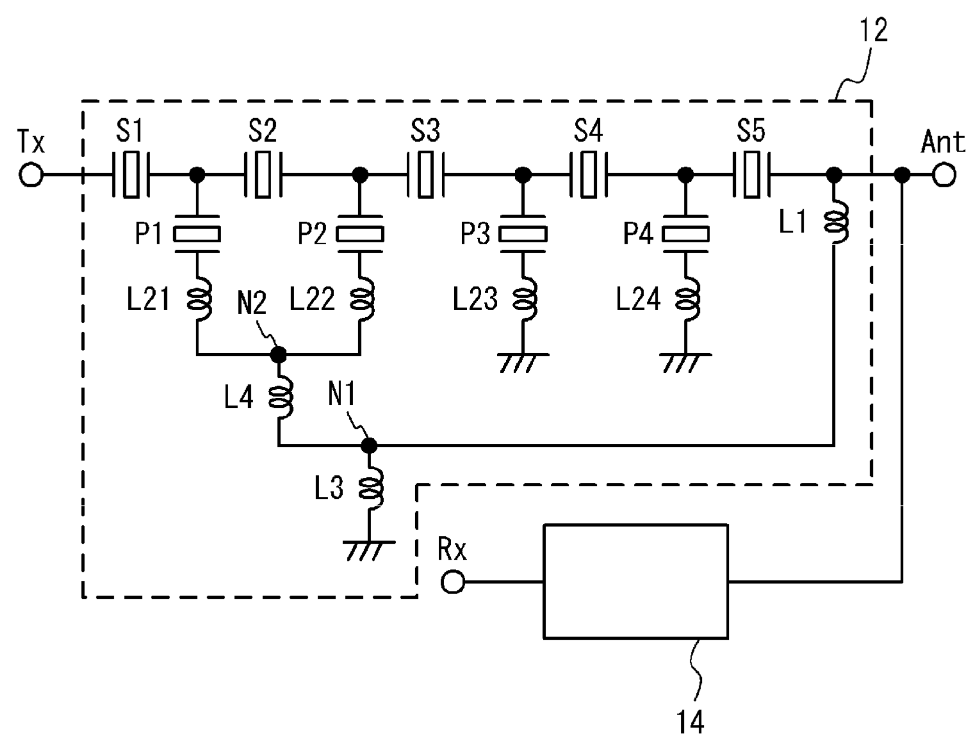
FIG. 7 is a circuit diagram of a duplexer according to a variation example 1 of the second embodiment.

FIG. 7 is a circuit diagram of a duplexer according to a variation example 1 of the second embodiment. As illustrated in FIG. 7, in the transmission filter 12, the series resonators Si to S5 are connected in series between the common terminal Ant and the transmission terminal Tx. The parallel resonators P1 to P4 are connected in parallel between the common terminal Ant and the transmission terminal Tx. The inductor L1 is connected between the transmission terminal Tx and the node N1. The inductors L21 and L22 are connected between the parallel resonator P1 and the node N2 and between the parallel resonators P2 and the node N2, respectively. The inductors L23 and L24 are connected between the parallel resonator P3 and the ground and between the parallel resonators P4 and the ground, respectively. The inductor L4 is connected between the node N1 and the node N2. The inductor L3 is connected between the node N1 and the ground. Since other configurations are the same as corresponding configurations of the variation example 1 of the first embodiment, a description thereof is omitted.

The inductances of the inductors L1, L3 and L4 are 2.7 nH, 0.01 nH and 0.7 nH, respectively. The inductances of the inductors L21 to L24 are optimized so that the attenuation amount becomes large in the reception band.

In a comparative example 3, the inductor L3 of FIG. 7 is not provided, and the inductors L1 and L4 are directly grounded. The inductance of each inductor is optimized so that the attenuation amount becomes large in the reception band.

Figure 8A:
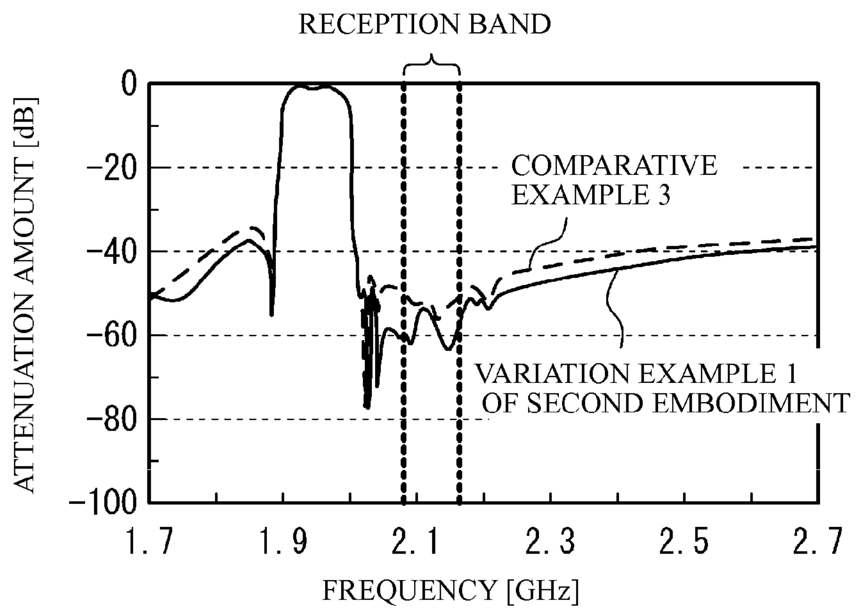
FIG. 8A is a diagram illustrating attenuation characteristics of transmission filters according to the variation example 1 of the second embodiment and a comparative example 3.
Figure 8B:
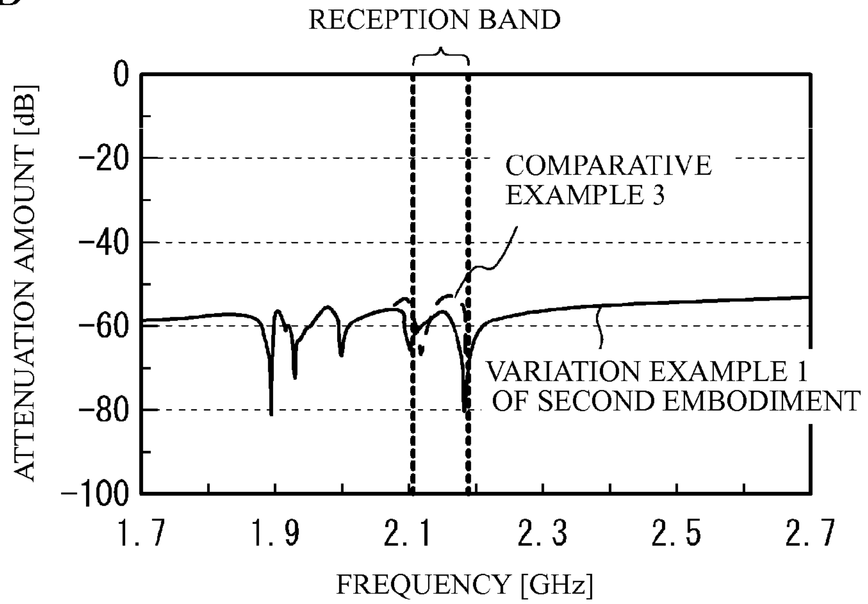
FIG. 8B is a diagram illustrating an isolation characteristic from a transmission terminal to a reception terminal.

FIG. 8A is a diagram illustrating attenuation characteristics of transmission filters according to the variation example 1 of the second embodiment and the comparative example 3. FIG. 8B is a diagram illustrating an isolation characteristic from the transmission terminal to the reception terminal. As illustrated in FIG. 8A, in the variation example 1 of the second embodiment, the attenuation amount becomes large in frequencies outside the passband of the transmission filter 12, compared with the comparative example 3. Also in the reception band, the attenuation amount is large. As illustrated in FIG. 8B, in the variation example 1 of the second embodiment, the isolation characteristic is improved, compared with the comparative example 3.

According to the second embodiment, the inductors L2 are connected to at least two parallel resonators P. The inductors L2 are connected to the node N2 (i.e., a second node). The inductor L4 is connected between the node N1 and the node N2. Thus, even when the inductor L4 is provided, it is possible to increase the attenuation amount outside the passband of the filter.

(Third Embodiment)

Figure 9A:
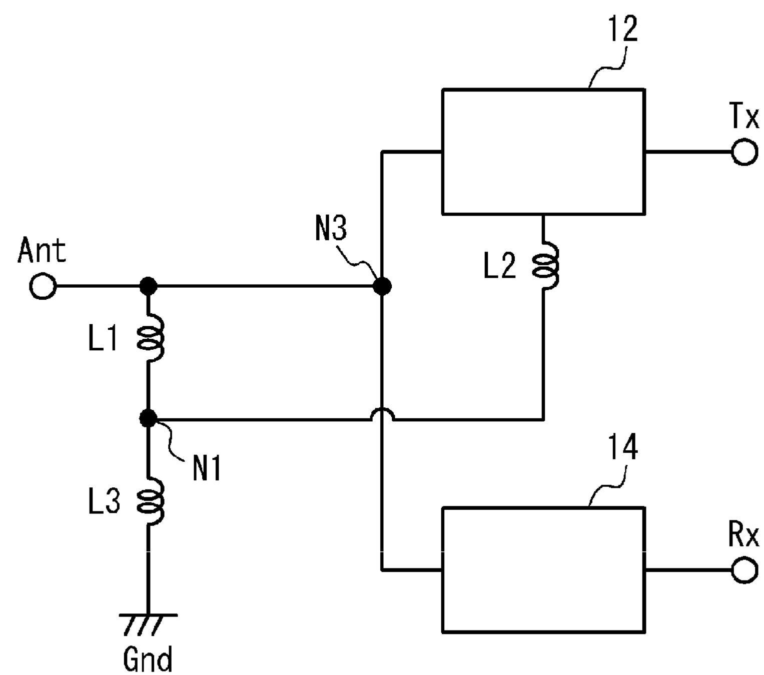
FIG. 9A is a circuit diagram of a duplexer according to a third embodiment.

A third embodiment indicates an example of forming inductors in a laminated substrate. FIG. 9A is a circuit diagram of a duplexer according to the third embodiment. As illustrated in FIG. 9A, the transmission filter 12 is connected between the common terminal Ant and the transmission terminal Tx. The reception filter 14 is connected between the common terminal Ant and the reception terminal Rx. The inductor L1 is connected between the node N1 and a node between the common terminal Ant and a node N3 to which the transmission filter 12 and the reception filter 14 are connected in common. The inductor L2 is connected between at least a part of grounds in the transmission filter 12 and the node N1. The inductor L3 is connected between the node N1 and a ground Gnd.

Figure 9B:
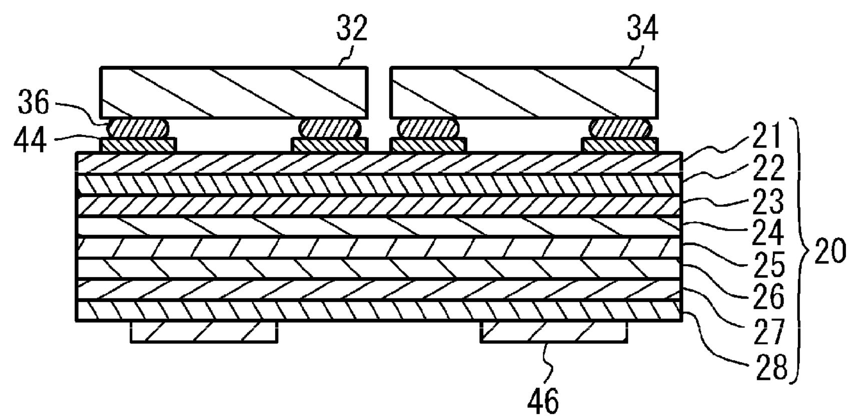
FIG. 9B is a cross-section diagram of the duplexer.

FIG. 9B is a cross-section diagram of the duplexer according to the third embodiment. A laminated substrate 20 includes a plurality of laminated layers 21 to 28. The layers 21 to 28 are insulating layers, such as ceramic layers or resin layers. Pads 44 are formed on an upper surface of the laminated substrate 20, and foot pads 46 are formed on a lower surface of the laminated substrate 20. Each of the pads 44 and the foot pads 46 is a metal film, such as gold, copper or aluminium. Chips 32 and 34 are flip-chip mounted on the pads 44 placed on the upper surface of the laminated substrate 20 via bumps 36. The transmission filter 12 and the reception filter 14 are formed in the chips 32 and 34, respectively. The chips 32 and 34 may be configured by a single chip. That is, the transmission filter 12 and the reception filter 14 may be formed in the same chip. Each of the bumps 36 is a gold bump or a solder bump.

Figure 10A:
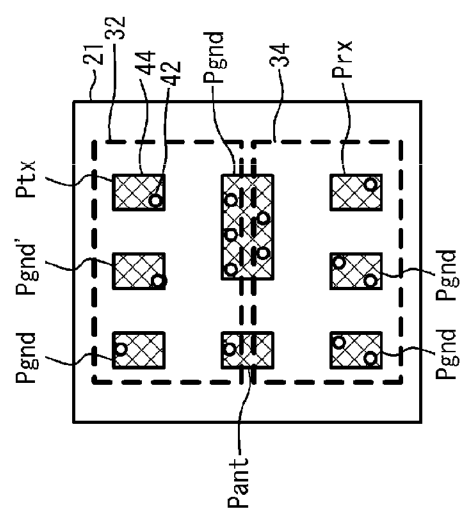
FIGS. 10A to 10E are plain views illustrating respective layers of a package substrate (part 1)
Figure 10B:
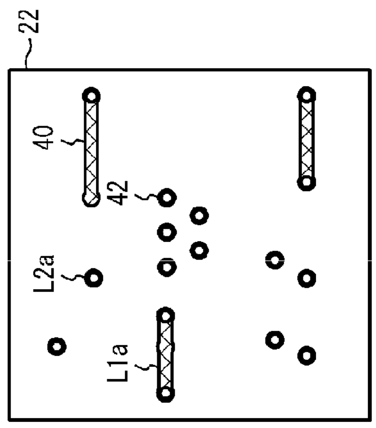
Figure 10C:
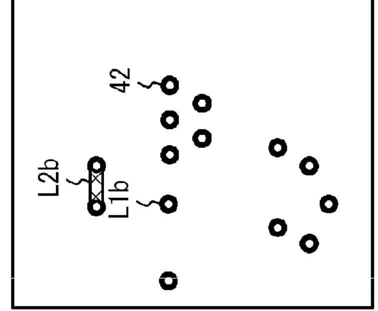
Figure 10D:
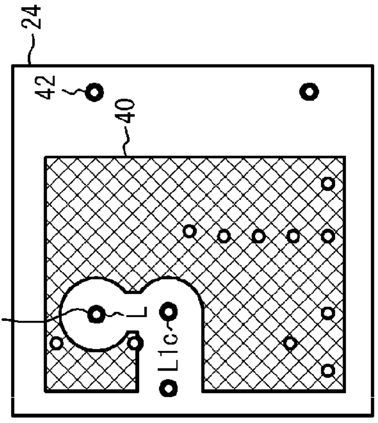
Figure 10E:
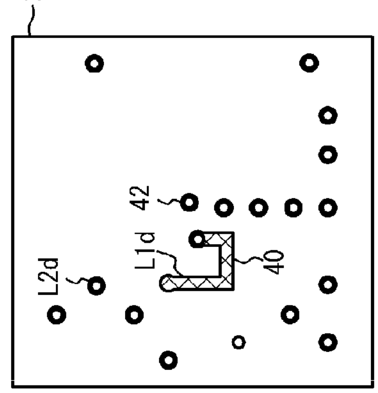
Figure 11A:
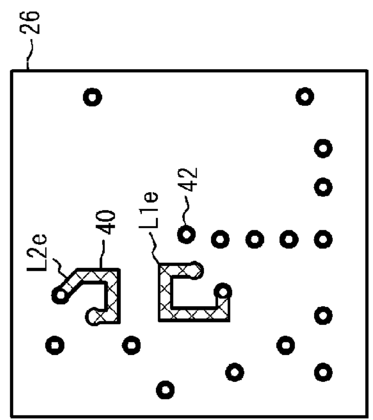
FIGS. 11A to 11D are plain views illustrating respective layers of the package substrate (part 2)
Figure 11B:
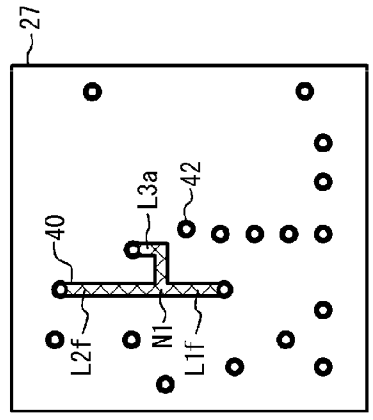
Figure 11C:
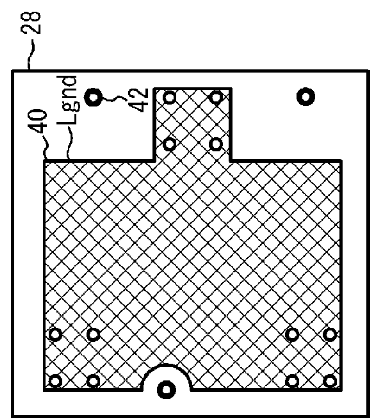
Figure 11D:
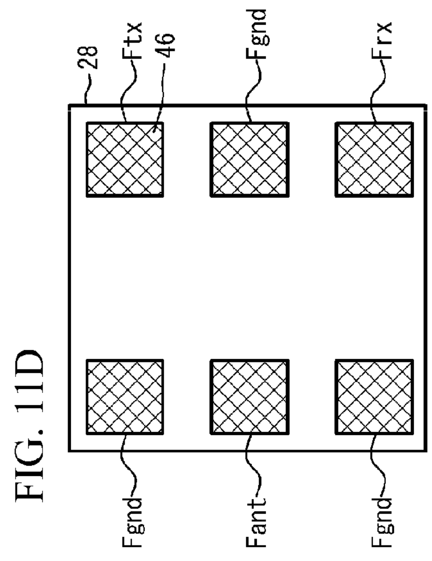

FIGS. 10A to 11D are plain views illustrating respective layers of a package substrate. FIGS. 10A to 11C are plain views illustrating upper surfaces of the respective layers. FIG. 11D is a plain view that transmits a lower surface of the layer 28 from above. As illustrated in FIG. 10A, the pads 44 are formed on the layer 21. Via metals 42 that pass through the layer 21 are formed on the layer 21. The pads 44 include a transmission pad Ptx, an antenna pad Pant, a reception pad Prx and ground pads Pgnd.

As illustrated in FIGS. 10B to 11C, metal films 40 are formed on the layers 22 to 28. Each of the metal films 40 forms a wiring. The via metals 42 are formed so as to pass through the layers 22 to 28. Each of the metal films 40 and the via metals 42 is a metal film, such as gold, copper or aluminium.

As illustrated in FIG. 11D, the foot pads 46 are formed under the layer 28. The foot pads 46 includes a transmission foot pad Ftx, an antenna foot pad Fant, a reception foot pad Frx and ground foot pads Fgnd. The transmission foot pad Ftx, the antenna foot pad Fant, the reception foot pad Frx and the ground foot pads Fgnd correspond to the transmission terminal Tx, the common terminal Ant, the reception terminal Rx and the ground Gnd of FIG. 9A, respectively.

Wirings or via metals L1*a* to L1*f* illustrated in FIGS. 10B to 11B correspond to the inductor L1. Wirings or via metals L2*a* to L2*f* correspond to the inductor L2. As illustrate in FIG. 11B, in the layer 27, the wirings L1*f* and L2*f* are connected to each other at the node N1. The wiring L3*a* is connected to the node N1. As illustrated in FIGS. 11B and 11C, an end of the wiring L3*a* opposite to the node N1 is connected to a ground wiring Lgnd of the layer 28 via the via metal 42. The wiring L3*a* corresponds to the inductor L3.

The ground wiring Lgnd is electrically connected to the ground foot pads Fgnd via the via metals 42 passing through the layer 28. The pads Ptx, Prx and Pant are electrically connected to the foot pads Ftx, Frx and Fant, respectively.

Figure 12:
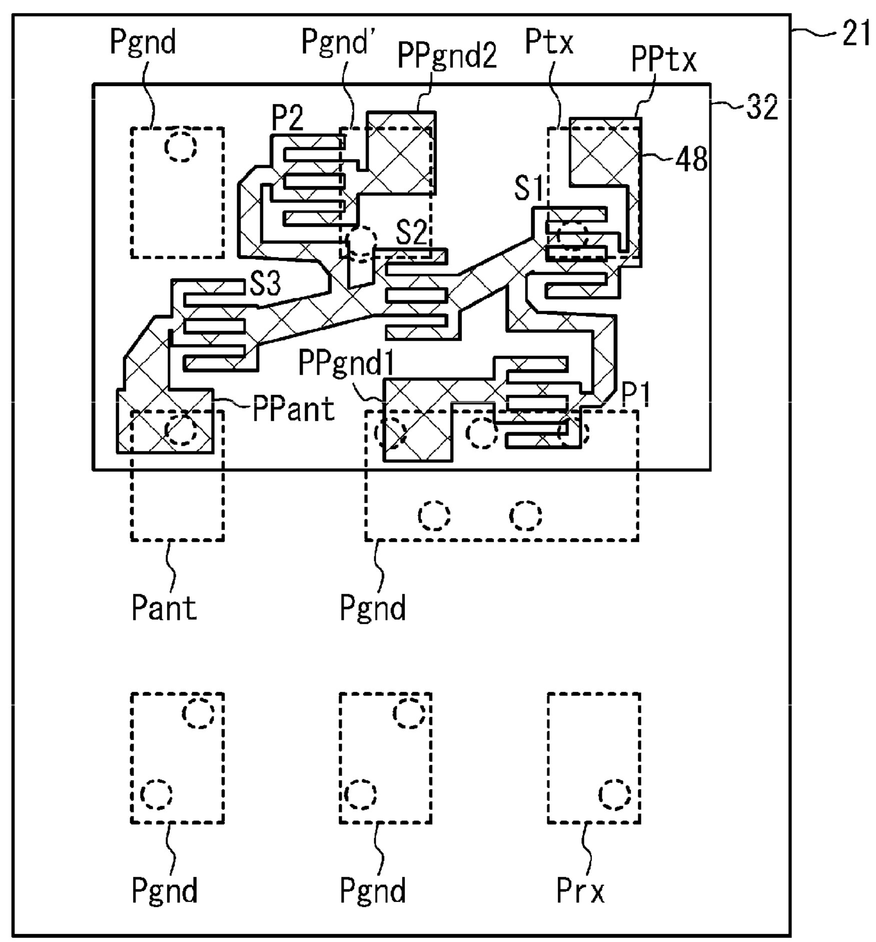
FIG. 12 is a plain view that transmits a surface of a chip mounted on a laminated substrate from above.

FIG. 12 is a plain view that transmits a surface of the chip mounted on the laminated substrate from above. A metal film 48 is formed on the surface of the chip 32 (i.e., a lower surface of the chip 32 illustrated in FIG. 9B). Each of the series resonators Si to S3 and the parallel resonators P1 and P2 is a surface acoustic wave resonator, and has an interdigital electrode made of the metal film 48. Pads PPant, PPtx, PPgnd1 and PPgnd2 are made of the metal film 48. The series resonators Si to S3 are formed between the pads PPant and PPtx. The parallel resonators P1 and P2 are connected to the pads PPgnd1 and PPgnd2, respectively. The pads PPant, PPtx, PPgnd1 and PPgnd2 are connected to the pads Pant, Ptx, Pgnd and Pgnd' on the layer 21 via the bumps 36, respectively.

Figure 13:
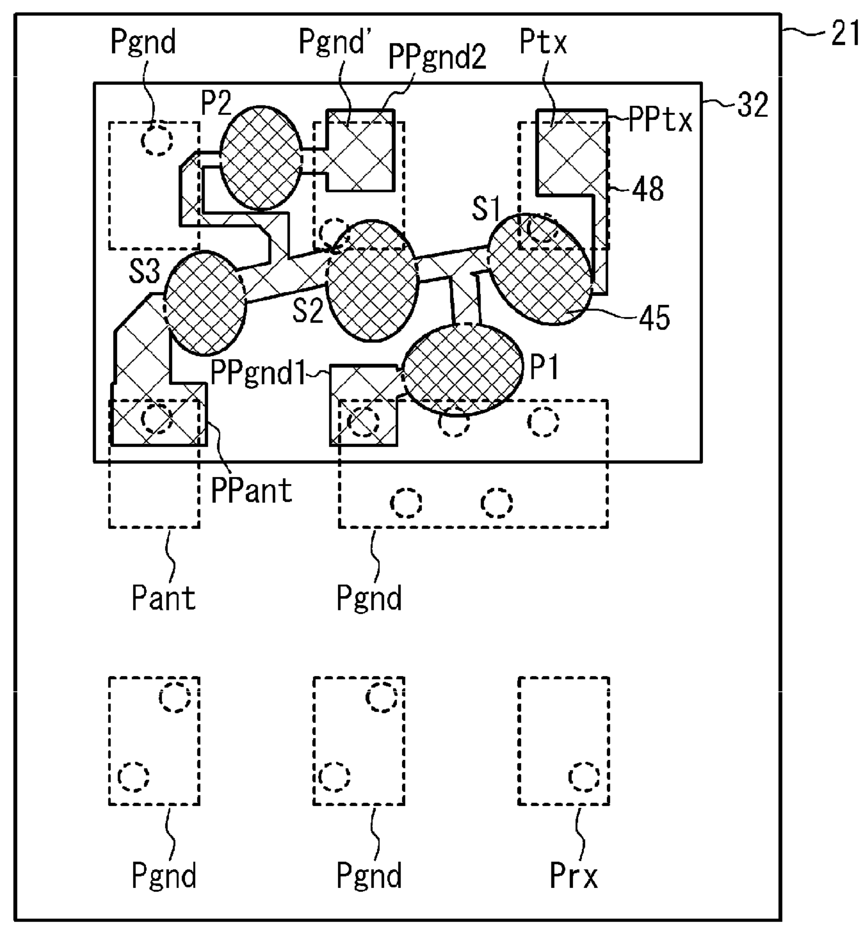
FIG. 13 is a plain view that transmits a surface of another chip mounted on the laminated substrate from above.

FIG. 13 is a plain view that transmits a surface of another chip mounted on the laminated substrate from above. Resonance regions 45 and the metal film 48 are formed on the surface of the chip 32. Each of the resonance regions 45 is a region that sandwiches a piezoelectric film and where a lower electrode and an upper electrode are opposite to each other. Each of the series resonators Si to S3 and the parallel resonators P1 and P2 is a piezoelectric thin film resonator having the resonance region 45. Since other configurations are the same as corresponding configurations of FIG. 12, a description thereof is omitted.

As described in the third embodiment, at least one of the inductors L1 to L3 can be formed on the laminated substrate 20 (i.e., a second substrate) on which at least one of the chips 32 and 34 (i.e., a first substrate) is mounted. When the filter of the second embodiment is provided on the laminated substrate 20 as with the third embodiment, the inductor L4 may be formed on the laminated substrate 20.

In the duplexer having the transmission filter 12 and the reception filter 14, at least one of the transmission filter 12 and the reception filter 14 can be used as the filter of the first or second embodiment. Thereby, the attenuation amount in the passband of another filter other than the filter of the first or second embodiment can be improved. In addition, the isolation characteristic can be improved.

Moreover, as described in the third embodiment, the inductor L1 can be used as an inductor for matching circuit connected between the common terminal Ant and the node N1 of the duplexer.

As illustrated in FIG. 12 or 13, the surface acoustic wave resonator or the piezoelectric thin film resonator can be used as the series resonator and the parallel resonator. Alternatively, an acoustic boundary wave resonator or a love wave resonator can be used as the series resonator and the parallel resonator.

(Fourth Embodiment)

Figure 14:
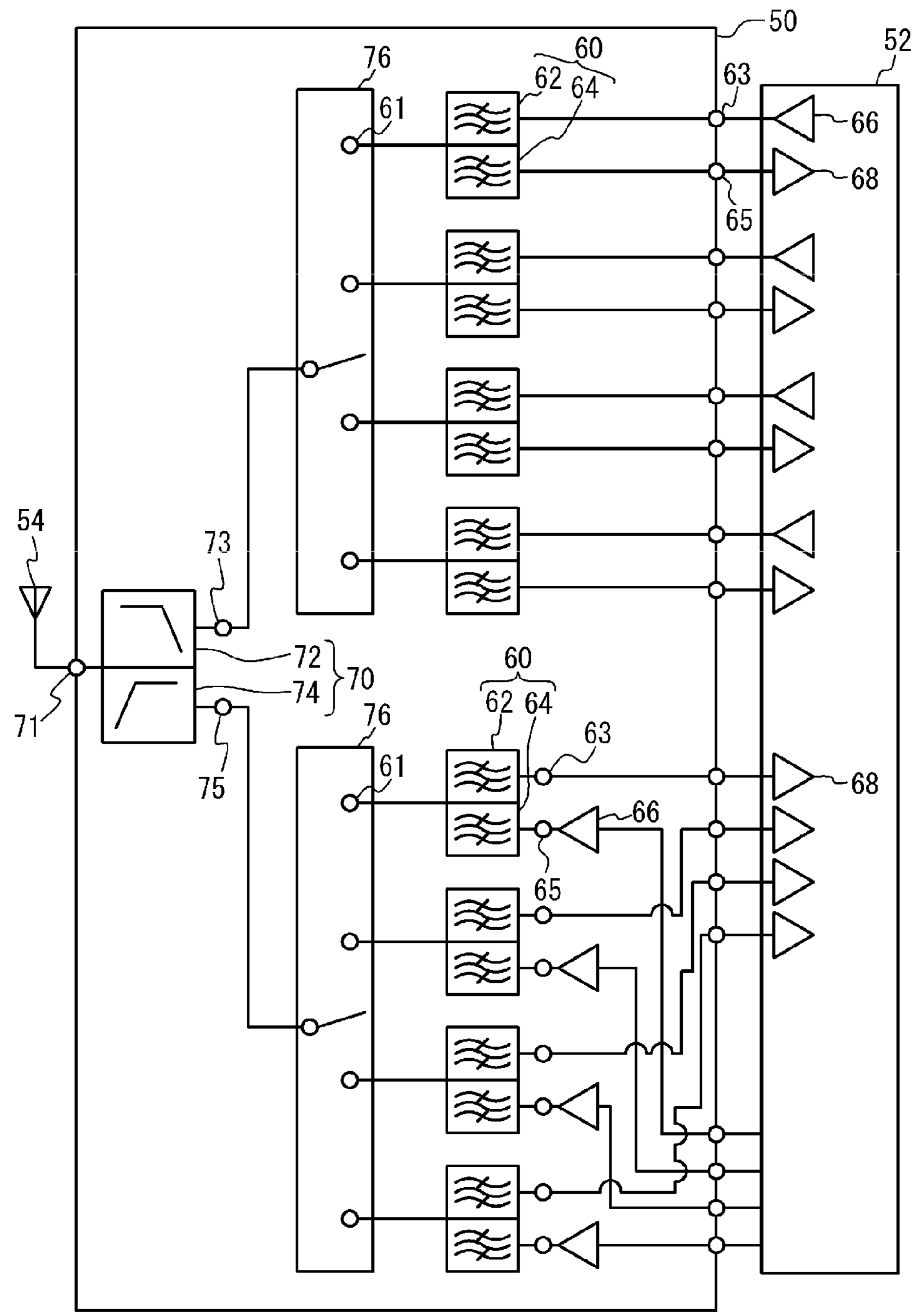
FIG. 14 is a block diagram of a system including a module according to a fourth embodiment.

A fourth embodiment indicates an example of a module having the filter of the first embodiment and the second embodiment, or the duplexer of the third embodiment. FIG. 14 is a block diagram of a system including the module according to the fourth embodiment. As illustrated in FIG. 14, the system includes a module 50, an integrated circuit 52 and an antenna 54. The module 50 includes a diplexer 70, switches 76, duplexers 60 and power amplifiers 66. The diplexer 70 includes a low-pass filter (LPF) 72 and a high-pass filter (HPF) 74. The LPF 72 is connected between terminals 71 and 73. The HPF 74 is connected between the terminal 71 and a terminal 75. The terminal 71 is connected to the antenna 54. The LPF 72 passes a low frequency signal and suppresses a high frequency signal among signals transmitted and received with the antenna 54. The HPF 74 passes the high frequency signal and suppresses the low frequency signal among the signals transmitted and received with the antenna 54.

One of the switches 76 connects the terminal 73 to any one of a plurality of terminals 61, and the other of the switches 76 connects the terminals 75 to any one of a plurality of terminals 61. Each of the duplexers 60 includes a transmission filter 62 and a reception filter 64. The transmission filter 62 is connected between the terminals 61 and 63. The reception filter 64 is connected between the terminals 61 and 65. The transmission filter 62 passes a signal of the transmission band and suppresses other signals. The reception filter 64 passes a signal of the reception band and suppresses other signals. Each of the power amplifiers 66 amplifies a transmission signal and outputs the amplified signal to a corresponding terminal 63. Each of low noise amplifiers 68 amplifies a reception signal outputted to a corresponding terminal 65.

The filter of the first or second embodiment can be used as at least one of the transmission filters 62 and the reception filters 64 in the duplexers 60. When the filter or the duplexer of the third embodiment is used, a substrate included in the module 50 can be used as the laminated substrate 20 of the third embodiment.

In the fourth embodiment, a front-end module for mobile communication terminal is explained as an example of the module, but the module may be other kind of module.

Although the embodiments of the present invention have been described in detail, the present invention is not limited to these specific embodiments, and the various changes, substitutions, and alterations could be made hereto without departing from the spirit and scope of the invention.

What is claimed is:

1. A filter comprising:
one or more series resonators connected in series between an input terminal and an output terminal;
one or more parallel resonators connected in parallel between the input terminal and the output terminal;
a first inductor having one end connected to at least one of the input terminal and the output terminal without via any resonators;
a second inductor having one end connected to a terminal near a ground of at least one of the parallel resonators; and
a third inductor connected between a first node and the ground, the first node connecting the other end of the first inductor and the other end of the second inductor.

2. The filter as claimed in claim 1, comprising:
the second inductor comprising at least two second inductors each having one end connected to respective one of at least two parallel resonators among the one or more parallel resonators; and
a fourth inductor inserted between a second node and the first node, the second node connecting the other ends of the at least two second inductors in common.

3. The filter as claimed in claim 1, wherein
the first inductor is connected to any one of between the input terminal and the first node and between the output terminal and the first node.

4. The filter as claimed in claim 1, comprising:
a first substrate on which the one or more series resonators and the one or more parallel resonators are formed; and
a second substrate on which the first substrate is mounted and the first to the third inductors are formed.

5. A duplexer comprising:
a transmission filter connected between a common terminal and a transmission terminal; and
a reception filter connected between the common terminal and a reception terminal;
wherein at least one of the transmission filter and reception filter is a filter as claimed in claim 1.

6. The duplexer as claimed in claim 5, wherein
the first inductor is connected to the common terminal and the first node.

7. A module comprising:

a filter as claimed in claim 1.

* * * * *